United States Patent
Choi

(10) Patent No.: US 12,123,518 B2
(45) Date of Patent: Oct. 22, 2024

(54) SOLENOID VALVE DIAGNOSTIC APPARATUS AND METHOD

(71) Applicants: Hyundai Motor Company, Seoul (KR); Kia Corporation, Seoul (KR)

(72) Inventor: Hae Pin Choi, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/374,053

(22) Filed: Jul. 13, 2021

(65) Prior Publication Data

US 2022/0213978 A1 Jul. 7, 2022

(30) Foreign Application Priority Data

Jan. 6, 2021 (KR) .................. 10-2021-0001591

(51) Int. Cl.
*F16K 37/00* (2006.01)
*G01R 31/28* (2006.01)

(52) U.S. Cl.
CPC ...... *F16K 37/0041* (2013.01); *F16K 37/0025* (2013.01); *G01R 31/2829* (2013.01)

(58) Field of Classification Search
CPC ............. F16K 37/0041; F16K 37/0025; G01R 31/2829

USPC .................................................. 137/551–557
See application file for complete search history.

(56) References Cited

U.S. PATENT DOCUMENTS

| | | | |
|---|---|---|---|
| 6,815,101 B2 * | 11/2004 | de Vaal ............... | H01M 8/2457 429/444 |
| 10,378,501 B2 | 8/2019 | Sarwar et al. | |
| 10,443,530 B1 | 10/2019 | Li et al. | |

FOREIGN PATENT DOCUMENTS

| | | | | |
|---|---|---|---|---|
| GB | 2367962 A | * | 4/2002 | ............... B60T 8/36 |
| JP | 09196991 A | * | 7/1997 | |
| KR | 2003034911 A | * | 5/2003 | ......... F16H 61/0251 |
| KR | 100394683 B1 | | 8/2003 | |
| KR | 20200071175 A | | 6/2020 | |
| WO | WO-2019098104 A1 | * | 5/2019 | ............... B61F 5/24 |

* cited by examiner

*Primary Examiner* — Angelisa L. Hicks
(74) *Attorney, Agent, or Firm* — Fox Rothschild LLP

(57) ABSTRACT

A solenoid valve diagnostic apparatus includes a plurality of solenoid valves that open or close an entrance/exit opening of a fuel tank, a current sensor that measures an operating current of the solenoid valves, and a controller that diagnoses whether the solenoid valves fail, based on the operating current measured by the current sensor.

13 Claims, 3 Drawing Sheets

SOLENOID VALVE DIAGNOSTIC APPARATUS AND METHOD

CROSS-REFERENCE TO RELATED APPLICATION

This application claims under 35 U.S.C. § 119(a) the benefit of Korean Patent Application No. 10-2021-0001591, filed in the Korean Intellectual Property Office on Jan. 6, 2021, the entire contents of which are incorporated herein by reference.

BACKGROUND

(a) Technical Field

The present disclosure relates to a solenoid valve diagnostic apparatus and method for diagnosing failure of a solenoid valve in a hydrogen storage system for driving a fuel cell system.

(b) Description of the Related Art

A fuel cell vehicle travels using electrical energy produced by an electrochemical reaction of hydrogen and oxygen. The fuel cell vehicle includes a fuel cell that produces electrical energy and a fuel tank that stores hydrogen to be supplied to the fuel cell. The fuel tank is equipped with a solenoid valve. The solenoid valve controls input of hydrogen to the fuel tank and output of the hydrogen from the fuel tank. When a supply of hydrogen fuel to the fuel cell is limited due to failure of the solenoid valve, the amount of electricity generated is decreased, and therefore the vehicle cannot travel. In the related art, to diagnose a failure of the solenoid valve, a controller monitors, through a current sensor, a current supplied to the solenoid valve and enters a failure diagnosis mode when the corresponding current is detected to be less than or equal to a predetermined current value. However, the failure diagnosis method in the related art cannot perform diagnosis through signal feedback in the event of pulse width modulation (PWM) duty 100% or DC-type solenoid valve control. Therefore, it is necessary to enter a diagnostic mode through the current sensor and to mount as many current sensors as valves for diagnosis of each solenoid valve. Due to this requirement, the size of the controller may be increased, and production costs may be excessive.

SUMMARY

An aspect of the present disclosure provides a solenoid valve diagnostic apparatus and method for diagnosing failure of a plurality of solenoid valves, by using a single current sensor.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a solenoid valve diagnostic apparatus includes a plurality of solenoid valves that open or close an entrance/exit opening of a fuel tank, a current sensor that measures an operating current of the solenoid valves, and a controller that diagnoses whether the solenoid valves fail, based on the operating current measured by the current sensor.

The controller may determine whether the measured operating current satisfies a condition for entrance to a diagnostic mode.

The condition for entrance to the diagnostic mode may be that the measured operating current is less than reference currents differently set for respective check steps.

The controller may change duties of PWM control signals transmitted to the solenoid valves when the controller enters the diagnostic mode and may determine a solenoid valve normal situation, when the duties of the PWM control signals and duties of PWM control signals fed back from the solenoid valves are inverted.

The controller may maintain a current check step, when the solenoid valve normal situation is determined in the diagnostic mode.

The controller may determine solenoid valve failure, when the duties of the PWM control signals and the duties of the PWM control signals fed back are not inverted.

The controller may transition to a following check step, when the solenoid valve failure is determined.

According to another aspect of the present disclosure, a solenoid valve diagnostic method includes steps of: measuring, by a current sensor, an operating current of a plurality of solenoid valves; and diagnosing, by a controller, whether the solenoid valves fail, based on the measured operating current.

The diagnosing of whether the solenoid valves fail may include determining whether the measured operating current satisfies a condition for entrance to a diagnostic mode, entering the diagnostic mode, when the measured operating current satisfies the condition for entrance to the diagnostic mode, and determining solenoid valve failure by using a PWM feedback measurement method in the diagnostic mode.

The determining of whether the measured operating current satisfies the condition for entrance to the diagnostic mode may include determining whether the measured operating current is less than reference currents differently set for respective check steps.

The determining of the solenoid valve failure may include changing duties of PWM control signals transmitted to the solenoid valves, identifying duties of PWM control signals fed back from the solenoid valves, determining a solenoid valve normal situation, when the duties of the PWM control signals and the duties of the PWM control signals fed back are inverted, and determining solenoid valve failure, when the duties of the PWM control signals and the duties of the PWM control signals fed back are not inverted.

The diagnosing of whether the solenoid valves fail may include transitioning to a following check step, when the solenoid valve failure is determined.

The diagnosing of whether the solenoid valves fail may further include maintaining a current check step, when the solenoid valve normal situation is determined.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
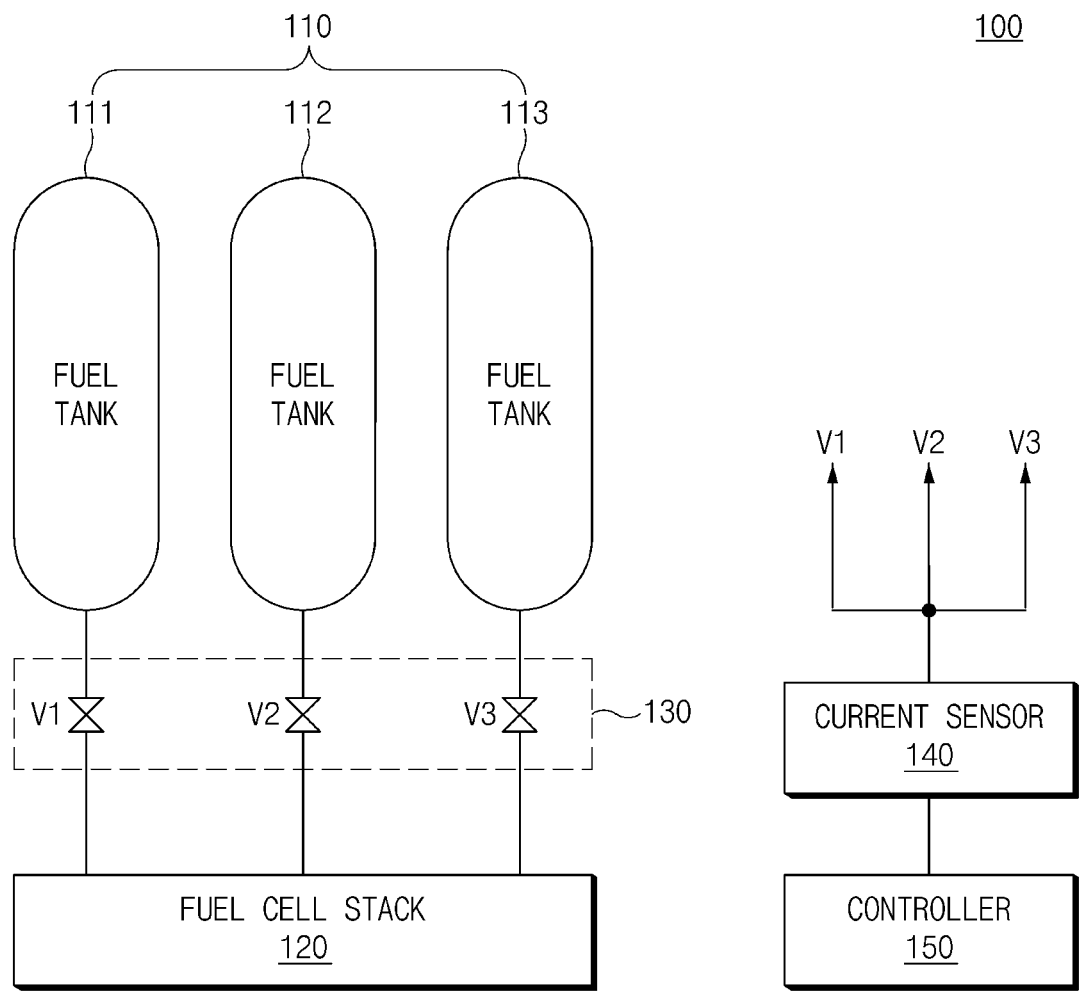
FIG. 1 is a view illustrating a configuration of a solenoid valve diagnostic apparatus according to embodiments of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of well-known features or functions will be ruled out in order not to unnecessarily obscure the gist of the present disclosure.

In describing the components of the embodiment according to the present disclosure, terms such as first, second, "A", "B", (a), (b), and the like may be used. These terms are merely intended to distinguish one component from another component, and the terms do not limit the nature, sequence or order of the components. Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Embodiments of the present disclosure relate to a technology for diagnosing whether a solenoid valve in a hydrogen storage system for driving a fuel cell system fails.

FIG. 1 is a view illustrating a configuration of a solenoid valve diagnostic apparatus 100 according to embodiments of the present disclosure.

Referring to FIG. 1, the solenoid valve diagnostic apparatus 100 may include a fuel tank 110, a fuel cell stack 120, a plurality of valves 130 (preferably, solenoid valves), a current sensor 140, and a controller 150.

The fuel tank 110 is a fuel supply apparatus that stores hydrogen to be supplied to the fuel cell stack 120. The fuel tank (or a plurality of fuel tanks) 110 may be equipped in a vehicle. In this embodiment, the fuel tank 110 is exemplified by three fuel tanks 111, 112, and 113 that are equipped in the vehicle. However, the present disclosure is not limited thereto. For example, one, two, four, or more fuel tanks 110 may be equipped in the vehicle.

The fuel cell stack 120 may produce electrical energy by an electrochemical reaction of hydrogen and oxygen. The fuel cell stack 120 may receive hydrogen from the fuel tank 110 and may produce electricity. The electrical energy generated by the fuel cell stack 120 may be used as energy for driving an electric motor (not illustrated).

The valves 130 may open or close supply passages of hydrogen fuel that is supplied from the fuel tank 110 to the fuel cell stack 120. The valves 130 may be opened or closed depending on control signals input from the controller 150 to supply hydrogen stored in the fuel tank 110 to the fuel cell stack 120 or interrupt the supply of the hydrogen to the fuel cell stack 120. The valves 130 may be mounted outside or inside the fuel tank 110. The valves 130 may include a first solenoid valve V1, a second solenoid valve V2, and a third solenoid valve V3 mounted outside or inside the first fuel tank 111, the second fuel tank 112, and the third fuel tank 113, respectively. The number of valves 130 may be increased with an increase in the number of fuel tanks 110.

The current sensor 140 may measure an operating current (a driving current) of the valves 130. The current sensor 140 may measure a total current supplied to the first solenoid valve V1, the second solenoid valve V2, and the third solenoid valve V3. In this embodiment, the current sensor 140 is described as being located outside the controller 150. However, without being limited thereto, the current sensor 140 may be configured to be located inside the controller 150.

The controller 150 may be electrically connected with the valves 130 and the current sensor 140. The controller 150 may include a processor. The processor may control overall operation of the controller 150 and may be a central processing unit (CPU), a microcontroller, and/or a microprocessor. The controller 150 may further include a memory inside and/or outside the controller 150. The memory may be a non-transitory storage medium that stores instructions executed by the processor. The memory may be a flash memory, a hard disk drive, a random access memory (RAM), a read only memory (ROM), a programmable read only memory (PROM), an electrically erasable and programmable ROM (EEPROM), an erasable and programmable ROM (EPROM), and/or a register.

The controller 150 may control opening/shutting of the valves 130 by using pulse width modulation (PWM) control. The controller 150 may adjust duties of PWM control signals supplied to the valves 130.

The controller 150 may detect the operating current of the valves 130 by using the current sensor 140. The controller 150 may determine whether to enter a diagnostic mode for diagnosis of failure of the solenoid valves, based on the detected operating current. The controller 150 may determine whether to transition to a check step, based on an outcome of diagnosis in the diagnostic mode. The controller 150 may maintain the current check step when a solenoid valve normal situation is diagnosed and may transition to a following check step when solenoid valve failure is diagnosed. The number of check steps may be determined based on the number of solenoid valves, and conditions for entrance to diagnostic modes, that is, reference currents may be differently set for the respective check steps. For example, in a case where the number of solenoid valves is N, the check steps may be divided into a first check step of checking states of the solenoid valves when N solenoid valves are normal, a second check step of checking states of the solenoid valves when N−1 solenoid valves are normal, . . . , and an Nth check step of checking states of the solenoid valves when one solenoid valve is normal.

When operating currents detected in the respective check steps satisfy the conditions for entrance to the diagnostic modes, the controller 150 may enter the diagnostic modes and may diagnose the valves 130. At this time, the controller 150 may determine whether the solenoid valves fail, by using a PWM feedback measurement method. The controller 150, when entering the diagnostic modes, may change PWM duties of control signals transmitted to the valves 130. For example, the controller 150 may change the duties of the PWM control signals from 100% to 90%. The controller 150 may transmit the PWM control signals having the changed duties to the valves 130 and may receive PWM control signals (that is, PWM feedback signals) fed back from the valves 130. The controller 150 may identify duties of the PWM feedback signals and may determine whether the solenoid valves fail, based on the identified duties. The controller 150 may determine whether the duties of the PWM control signals and the duties of the PWM feedback signals are inverted. When it is determined that the duties of the PWM control signals and the duties of the PWM feedback signals are inverted, the controller 150 may determine a solenoid valve normal situation. When it is determined that the duties of the PWM control signals and the duties of the PWM feedback signals are not inverted, the controller 150 may determine solenoid valve failure.

Hereinafter, a case of diagnosing a failure in the three solenoid valves V1, V2, and V3 will be described as an example.

When the three solenoid valves V1, V2, and V3 are normal, the controller 150 may operate in a first check step. In the first check step, the controller 150 may detect (measure) an operating current of the three solenoid valves V1, V2, and V3 by using the current sensor 140. The controller 150 may determine whether the detected operating current is greater than or equal to a first reference current (e.g., 2.1 A). When the detected operating current is greater than or equal to the first reference current, the controller 150 may determine a solenoid valve nominal situation. That is, the controller 150 may determine that all the solenoid valves V1, V2, and V3 are normal.

When the detected operating current is less than the first reference current, the controller may enter a first diagnostic mode. The controller 150, when entering the first diagnostic mode, may change PWM duties to 90% and may transmit PWM control signals having the changed duties to the solenoid valves V1, V2, and V3. The controller 150 may receive PWM feedback signals, may identify duties of the received PWM feedback signals, and may determine whether the solenoid valves fail. When the duties of the received PWM feedback signals are equal to 10%, the controller 150 may determine a solenoid valve normal situation. When the duties of the received PWM feedback signals are not equal to 10%, the controller 150 may determine solenoid valve failure.

When the solenoid valve normal situation is determined in the first diagnostic mode, the controller 150 may determine that all the solenoid valves V1, V2, and V3 are nominal. When the solenoid valve failure is determined in the first diagnostic mode, the controller 150 may transition to a following check step, that is, a second check step.

In the second check step, the controller 150 may detect an operating current of the solenoid valves V1, V2, and V3 by using the current sensor 140 and may determine whether the detected operating current is greater than or equal to a second reference current (e.g., 1.4 A). When the detected operating current is greater than or equal to the second reference current, the controller 150 may determine that two solenoid valves are normal.

When the detected operating current is less than the second reference current, the controller may enter a second diagnostic mode. As in the first diagnostic mode, the controller 150, when entering the second diagnostic mode, may diagnose solenoid valve failure by using a PWM feedback measurement method. When a solenoid valve normal situation is diagnosed in the second diagnostic mode, the controller 150 may determine that two solenoid valves are nominal. When solenoid valve failure is diagnosed in the second diagnostic mode, the controller 150 may transition to a following check step, that is, a third check step.

In the third check step, the controller 150 may measure an operating current of the solenoid valves V1, V2, and V3 by using the current sensor 140. The controller 150 may determine whether the measured operating current is greater than or equal to a third reference current (e.g., 0.7 A). When the measured operating current is greater than or equal to the third reference current, the controller 150 may determine that one solenoid valve is normal. When the measured operating current is less than the third reference current, the controller 150 may enter a third diagnostic mode. Even in the third diagnostic mode, the controller 150 may diagnose solenoid valve failure by using a PWM feedback measurement method. When a solenoid valve normal situation is diagnosed in the third diagnostic mode, the controller 150 may determine that one solenoid valve is normal. When solenoid valve failure is diagnosed, the controller 150 may determine that all the solenoid valves fail.

Figure 2A:
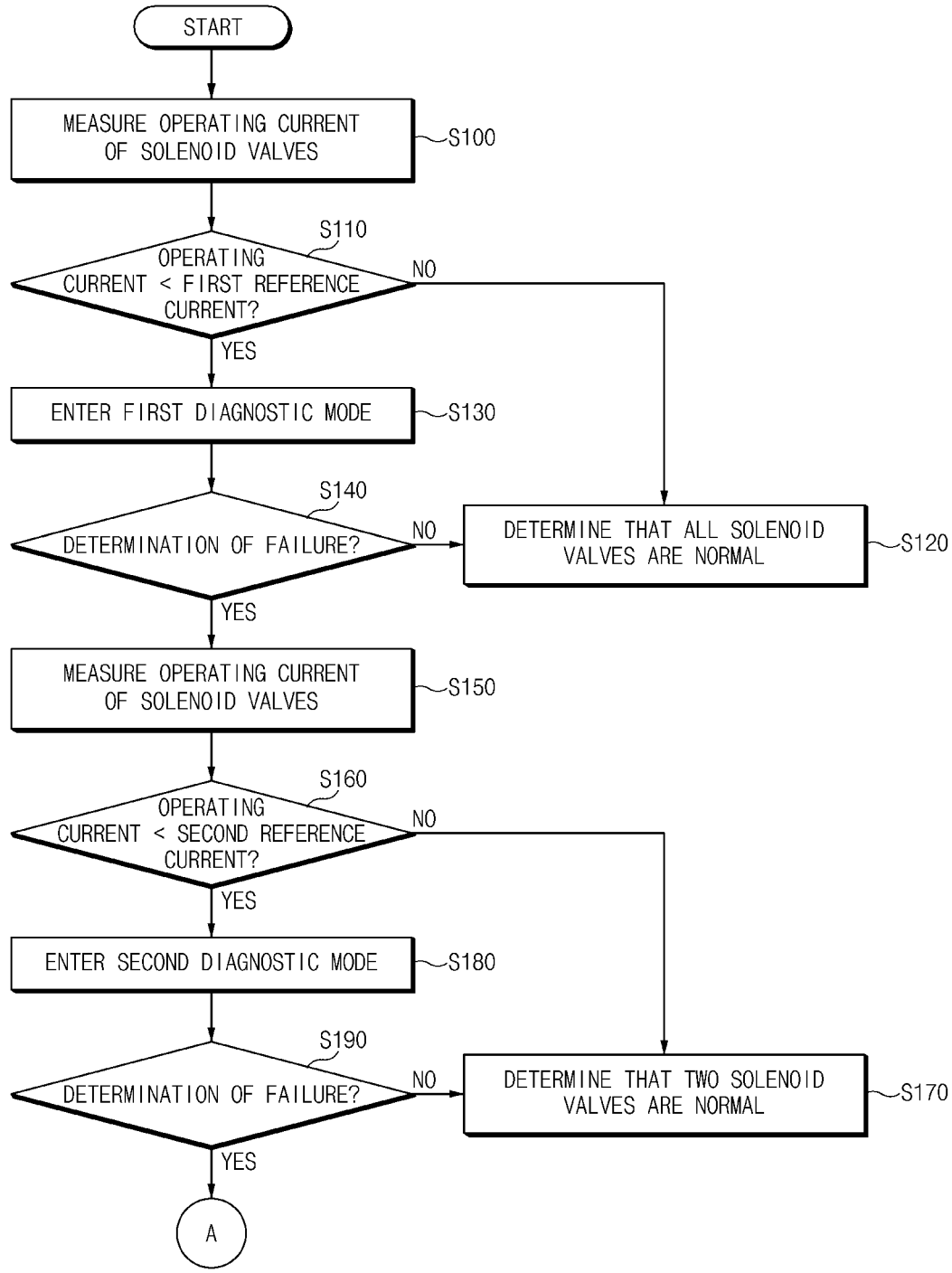
FIGS. 2A and 2B are flowcharts illustrating a solenoid valve diagnostic method according to embodiments of the present disclosure.
Figure 2B:
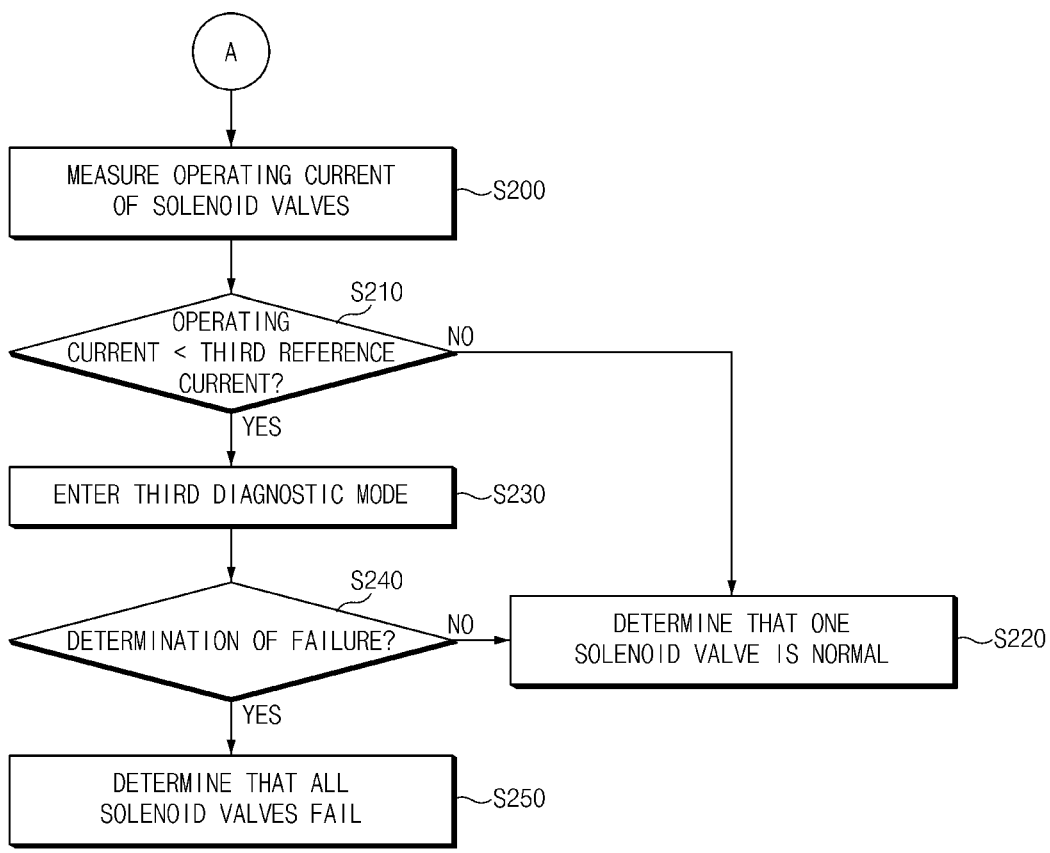

FIGS. 2A and 2B are flowcharts illustrating a solenoid valve diagnostic method according to embodiments of the present disclosure. In this embodiment, for a better understanding, a case of diagnosing a failure in the three solenoid valves V1, V2, and V3 will be described as an example. However, the present disclosure is not limited thereto.

The controller 150 may measure an operating current of the plurality of solenoid valves V1, V2, and V3 by using the current sensor 140 (S100). The controller 150 may measure a total current supplied to the solenoid valves V1, V2, and V3.

The controller 150 may determine whether the measured operating current is less than the first reference current (S110). The controller 150 may determine whether the measured operating current is less than the first reference current, for example, 2.1 A.

When the measured operating current is not less than the first reference current, the controller 150 may determine that all the solenoid valves are normal (S120). When the measured operating current is greater than or equal to the first reference current, the controller 150 may determine that the solenoid valves V1, V2, and V3 are normal.

When the measured operating current is less than the first reference current, the controller 150 may enter the first diagnostic mode (S130). The controller 150 may change duties of PWM control signals when entering the first diagnostic mode. For example, the controller 150 may change the duties of the PWM control signals from 100% to 90%.

In the first diagnostic mode, the controller 150 may determine whether the solenoid valves fail (S140). The controller 150 may transmit the PWM control signals having the changed duties to the solenoid valves V1, V2, and V3. The controller 150 may receive PWM feedback signals and may identify duties of the received PWM feedback signals. When the identified duties of the PWM feedback signals and the duties of the PWM feedback signals are inverted, that is, when the identified duties of the PWM feedback signals are equal to 10%, the controller 150 may determine a solenoid valve normal situation. When the identified duties of the PWM feedback signals are not equal to 10%, the controller 150 may determine solenoid valve failure.

When the solenoid valve normal situation is determined in the first diagnostic mode, the controller 150 may determine that all the solenoid valves are normal (S120).

When the solenoid valve failure is determined in the first diagnostic mode, the controller 150 may transition to a following check step and may measure an operating current of the plurality of solenoid valves V1, V2, and V3 by using the current sensor (S150).

The controller 150 may determine whether the measured operating current is less than the second reference current (S160). For example, the controller 150 may determine whether the measured operating current is less than 1.4 A.

When the measured operating current is not less than the second reference current, the controller 150 may determine that the remaining solenoid valves other than one of the plurality of solenoid valves V1, V2, and V3 are normal (S170). When the measured operating current is greater than or equal to the second reference current, the controller 150 may determine that two solenoid valves among the three solenoid valves V1, V2, and V3 are normal.

When the measured operating current is less than the second reference current, the controller 150 may enter the second diagnostic mode (S180).

In the second diagnostic mode, the controller 150 may determine whether the solenoid valves fail (S190). As in the first diagnostic mode, the controller 150, when entering the second diagnostic mode, may diagnose solenoid valve failure by using a PWM feedback measurement method.

When a solenoid valve normal situation is determined in the second diagnostic mode, the controller 150 may determine that two solenoid valves are normal (S170).

When solenoid valve failure is determined in the second diagnostic mode, the controller 150 may transition to a following check step and may measure an operating current of the plurality of solenoid valves V1, V2, and V3 by using the current sensor (S200).

The controller 150 may determine whether the measured operating current is less than the third reference current (S210).

When the measured operating current is not less than the third reference current, the controller 150 may determine that one solenoid valve is normal (S220). When the measured operating current is greater than or equal to the third reference current, the controller 150 may determine that one solenoid valve among the three solenoid valves V1, V2, and V3 is normal.

When the measured operating current is less than the third reference current, the controller 150 may enter the third diagnostic mode (S230).

In the third diagnostic mode, the controller 150 may determine whether the solenoid valves fail (S240). In the third diagnostic mode, the controller 150 may diagnose solenoid valve failure by using a PWM feedback measurement method.

When a solenoid valve normal situation is determined in the third diagnostic mode, the controller 150 may determine that one solenoid valve is normal (S220).

When solenoid valve failure is determined in the third diagnostic mode, the controller 150 may determine that all the solenoid valves fail (S250).

According to the present disclosure, whether the plurality of solenoid valves fail may be diagnosed by using the one current sensor. Thus, hardware and the size of the controller may be optimized, and cost savings may be achieved.

According to the present disclosure, whether the solenoid valves fail may be diagnosed through signal feedback even in event of PWM duty 100% or DC-type solenoid valve control.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, the exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

What is claimed is:

1. A solenoid valve diagnostic apparatus, comprising:
   a plurality of solenoid valves each configured to open or close an entrance/exit opening of a fuel tank;
   a single current sensor configured to measure an operating current supplied to the solenoid valves; and
   a controller configured to diagnose whether the solenoid valves fail, based on the operating current measured by the current sensor, wherein diagnosing whether the solenoid valves fail includes:
      in a current check step of a plurality of check steps, determining whether the measured operating current is less than a reference current for the current check step; and
      when the measured operating current is less than the reference current for the current check step, entering a diagnostic mode for the current check step;

wherein the reference currents are differently set for respective check steps of the plurality of check steps; and wherein the number of check steps is determined by the number of solenoid valves.

2. The solenoid valve diagnostic apparatus of claim 1, wherein the controller:
changes duties of PWM control signals transmitted to the solenoid valves when the controller enters the diagnostic mode; and
determines a solenoid valve normal situation, when the duties of the PWM control signals and duties of PWM control signals fed back from the solenoid valves are inverted.

3. The solenoid valve diagnostic apparatus of claim 2, wherein the controller maintains the current check step, when the solenoid valve normal situation is determined in the diagnostic mode.

4. The solenoid valve diagnostic apparatus of claim 2, wherein the controller determines solenoid valve failure, when the duties of the PWM control signals and the duties of the PWM control signals fed back are not inverted.

5. The solenoid valve diagnostic apparatus of claim 4, wherein the controller transitions to a following check step, when the solenoid valve failure is determined.

6. The solenoid valve diagnostic apparatus of claim 1 wherein the apparatus contains a single current sensor that is configured to measure an operating current of the plurality of solenoid valves.

7. The solenoid valve diagnostic apparatus of claim 1 consisting of:
a) a plurality of solenoid valves each configured to open or close an entrance/exit opening of a fuel tank;
b) a single current sensor configured to measure an operating current of the plurality of solenoid valves; and
c) a controller configured to diagnose whether the solenoid valves fail, based on the operating current measured by the current sensor.

8. A solenoid valve diagnostic method, comprising the steps of:
measuring, by a single current sensor, an operating current supplied to a plurality of solenoid valves; and
diagnosing, by a controller, whether the solenoid valves fail, based on the measured operating current;

wherein diagnosing whether the solenoid valves fail includes:
in a current check step of a plurality of check steps, determining whether the measured operating current is less than a reference current for the current check step; and
when the measured operating current is less than the reference current for the current check step, entering a diagnostic mode for the current check step;
wherein the reference currents are differently set for respective check steps of the plurality of check steps; and
wherein the number of check steps is determined by the number of solenoid valves.

9. The solenoid valve diagnostic method of claim 8, wherein diagnosing whether the solenoid valves fail further includes
determining solenoid valve failure by using a PWM feedback measurement method in the diagnostic mode.

10. The solenoid valve diagnostic method of claim 9, wherein determining the solenoid valve failure includes:
changing duties of PWM control signals transmitted to the solenoid valves;
identifying duties of PWM control signals fed back from the solenoid valves;
determining a solenoid valve normal situation, when the duties of the PWM control signals and the duties of the PWM control signals fed back are inverted; and
determining solenoid valve failure, when the duties of the PWM control signals and the duties of the PWM control signals fed back are not inverted.

11. The solenoid valve diagnostic method of claim 10, wherein diagnosing whether the solenoid valves fail includes:
transitioning to a following check step, when the solenoid valve failure is determined.

12. The solenoid valve diagnostic method of claim 10, wherein diagnosing whether the solenoid valves fail further includes:
maintaining the current check step, when the solenoid valve normal situation is determined.

13. The method of claim 8 wherein an operating current of a plurality of solenoid valves is measured by a single current sensor.

\* \* \* \* \*